(12) United States Patent
Igarashi

(10) Patent No.: US 7,624,389 B2
(45) Date of Patent: Nov. 24, 2009

(54) DESIGN EVALUATION SYSTEM AND DESIGN EVALUATION METHOD

(75) Inventor: Masato Igarashi, Yachiyo (JP)

(73) Assignee: Kabushiki Kaisha Toshiba (JP)

( * ) Notice: Subject to any disclaimer, the term of this patent is extended or adjusted under 35 U.S.C. 154(b) by 803 days.

(21) Appl. No.: 11/087,250

(22) Filed: Mar. 23, 2005

(65) Prior Publication Data

US 2005/0216894 A1    Sep. 29, 2005

(30) Foreign Application Priority Data

Mar. 25, 2004    (JP) .................... P2004-090327

(51) Int. Cl.
*G06F 9/45* (2006.01)
*G06F 17/18* (2006.01)

(52) U.S. Cl. .............. 717/158; 717/153; 717/154

(58) Field of Classification Search ............ None
See application file for complete search history.

(56) References Cited

U.S. PATENT DOCUMENTS 5,367,696 A * 11/1994 Abe .................. 717/153
6,434,714 B1 * 8/2002 Lewis et al. .......... 714/38
6,557,158 B1   4/2003 Nishida
6,658,652 B1 * 12/2003 Alexander et al. ...... 717/128
6,917,971 B1 * 7/2005 Klein .................. 709/224
7,340,726 B1 * 3/2008 Chelf et al. ........... 717/126
2002/0026291 A1 * 2/2002 Lee et al. .............. 702/186
2004/0168154 A1 * 8/2004 Yoneda et al. .......... 717/124

FOREIGN PATENT DOCUMENTS

JP    11-3367    1/1999

OTHER PUBLICATIONS

Norihiko Yoshida, "Design Patterns Applied to Object-Oriented SoC Design", Proc., SASIMI 2001, pp. 19-24, Oct. 18, 2001.

* cited by examiner

*Primary Examiner*—Tuan Q Dam
*Assistant Examiner*—Hanh T Bui
(74) *Attorney, Agent, or Firm*—Kilpatrick Stockton LLP

(57) ABSTRACT

A design evaluation system includes a static analyzer sampling functions and variables related to the functions from a source code, a compiler compiling the source code into an executable code, a dynamic analyzer sampling each life start time and each life end time of the variables in case where the executable code is executed, and a memory load calculator calculating each memory load of the variables by multiplying each life time of the variables by each size of the variables, the life time being difference between the life start time and the life end time.

17 Claims, 11 Drawing Sheets

FIG. 2

| 11 | 12 | 13 | 14 | 15 | 16 |
|---|---|---|---|---|---|
| CLASS NAME | MEMBER NAME | CATEGORY | REFERENCE RESOURCE | RESOURCE TO BE VARIED | TEMPORARY VARIABLE |
| A | a | VARIABLE | – | – | – |
|  | set_a() | FUNCTION | X.souce_of_a | a | tmp |
|  | ret_a() | FUNCTION | A | NOT DETECTED | NOT DETECTED |
| B | b | VARIABLE | – | – | – |
|  | set_b() | FUNCTION | Z | NOT DETECTED | tmp |
|  | ⋮ | ⋮ | ⋮ | ⋮ | ⋮ |

FIG. 3

| 18 | 19 | 20 |
|---|---|---|
| 0 | MAIN | START |
| 15 | A.set_a | START |
| 20 | A.set_a | END |
| 22 | B.set_b | START |
| ⋮ | ⋮ | ⋮ |
| 150 | SUM.add | END |
| 158 | MAIN | END |
|  |  |  |

FIG. 4

```
        START
          ↓
GENERATING STATIC ANALYSIS RESULT  — ST10
          ↓
   COMPILING SOURCE CODE           — ST11
          ↓
GENERATING DYNAMIC ANALYSIS RESULT — ST12
          ↓
   CALCULATING MEMORY LOAD         — ST13
          ↓
         END
```

CONDITION 9: $n_9 \geq$ THE NUMBER OF CLASSES
CONDITION 10: $n_{10} \geq$ THE NUMBER OF MEMBER VARIABLES
CONDITION 11: $n_{11} \geq$ THE NUMBER OF MEMBER FUNCTIONS
CONDITION 12: $n_{12} \geq$ THE NUMBER OF TEMPORARY VARIABLES CONDITION 13: $n_{13} \geq$ THE NUMBER OF GLOBAL VARIABLES CONDITION 14 : $n_{14} \geq$ THE NUMBER OF MEMBER VARIABLES

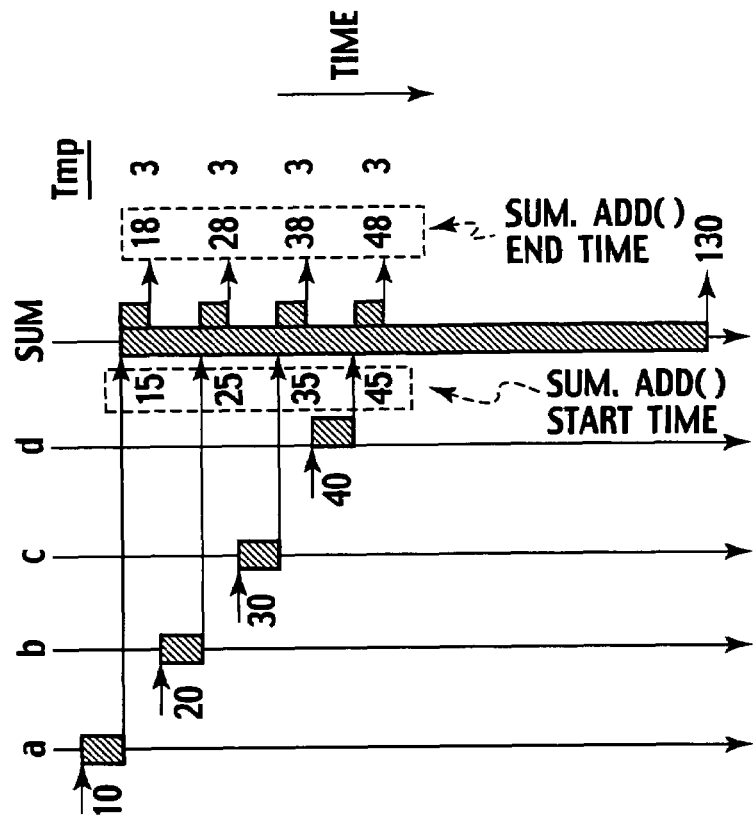

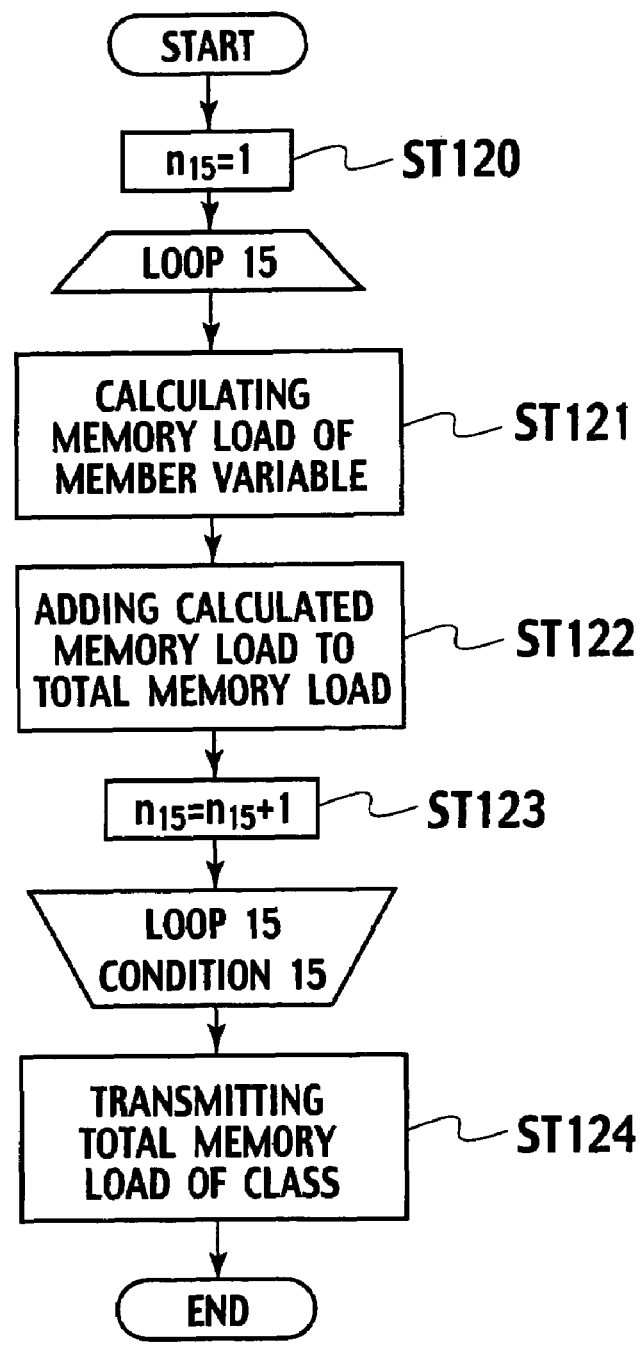

DESIGN EVALUATION SYSTEM AND DESIGN EVALUATION METHOD

CROSS REFERENCE TO RELATED APPLICATIONS AND INCORPORATION BY REFERENCE

This application is based upon and claims the benefit of priority from prior Japanese Patent Application P2004-090327 filed on Mar. 25, 2004; the entire contents of which are incorporated by reference herein.

BACKGROUND OF THE INVENTION

1. Field of the Invention

The invention relates to a design evaluation system and a design evaluation method for a system LSI, and more particularly to the apparatus and the method for assisting in design of the system LSI such as the system on chip using the electric design automation (EDA).

2. Description of the Related Art

To manufacture a semiconductor integrated circuit having a few tens of thousands of gates, design departments have provided register transfer level (RTL) data to manufacturing departments. By providing the RTL data, it has been possible to manufacture the semiconductor integrated circuit, which works expectedly, until the scheduled date of delivery. In the case where a semiconductor integrated circuit including a few hundreds of thousands of gates is designed, a physical synthesis system of an EDA tool is generally utilized to use an abstract design description language as described in Japanese Patent Laid-Open Publication No. Hei11-3367. In the SoC (system on chips), software and hardware are closely related to each other. Therefore, the degree of difficulty in designing system is increased. To solve the difficulty, a method using object-oriented analysis and design has been proposed. The method is applied to improve the efficiency of a process for designing software and hardware based on requirements definitions of the SoC.

However, a finer design rule of a semiconductor integrated circuit often makes it difficult to improve a yield rate of the system LSI, because of involving an additional aligner, mechanical stress on a wafer, contaminations of materials, and the complexity of the overall manufacturing process. In addition, designers are skeptical about whether state-of-the-art technique complies with the cost of production of chips. Therefore, a system and method for designing a system LSI are considerably affected by the success or failure of mass production of chips and the cost of mass production of the chips.

Moreover, proposed methods have not evaluated about utilization of patterns of a component such as a macro cell, since the proposed methods have not defined reliability planning and management or quality metrics which permit judging the quality of logic design of a system LSI.

Furthermore, designing the system LSI often involves redesign. The reason is as follows. Addition of module parallelism, design constraints, and channel definition information, which take place as a design process proceeds, result in generation of a system LSI that does not meet initial LSI specifications. Therefore, it has been required to resume an initial process even after downstream process has been accomplished.

SUMMARY OF THE INVENTION

An aspect of present invention inheres in a design evaluation system according to an embodiment of the present invention. The system contains a static analyzer configured to analyze a source code by sampling a plurality of functions and a plurality of variables related to the functions from the source code, a compiler configured to compile the source code into an executable code, a dynamic analyzer configured to analyze each life start time and each life end time of the variables in case where the executable code is executed, and a memory load calculator configured to calculate each memory load of the variables by multiplying each life time of the variables by each size of the variables, the life time being difference between the life start time and the life end time.

Another aspect of the present invention inheres in a computer implemented design evaluation method according to the embodiment of the present invention. The method includes sampling a plurality of functions and a plurality of variables related to the functions from a source code, compiling the source code into an executable code, sampling each life start time and each life end time of the variables in case where the executable code is executed, calculating each life time of the variables based on the life start time and the life end time, and calculating each memory load of the variables by multiplying the life time by each size of the variables.

Yet another aspect of the present invention inheres in a computer program product for the design evaluation system according to the embodiment of the present invention. The computer program product includes instructions configured to sample a plurality of functions and a plurality of variables relating to the functions from a source code within the system, instructions configured to compile the source code into an executable code within the system, instructions configured to sample each life start time and each life end time of the variables within the system in case where the executable code is executed, instructions configured to calculate each life time of the variables within the system, based on the life start time and the life end time, and instructions configured to calculate each memory load of the variables by multiplying the life time by each size of the variables within the system.

BRIEF DESCRIPTION OF DRAWINGS

FIG. 2 is a table showing data structure of a static analysis result in accordance with the first embodiment of the present invention;

FIG. 3 is a table showing data structure of a dynamic analysis result in accordance with the first embodiment of the present invention;

FIG. 4 is a first flowchart of a process for memory load calculation in accordance with the first embodiment of the present invention;

FIG. 11A shows an example description of the class source in accordance with a third embodiment of the present invention, FIG. 11B shows an example description of the class sum in accordance with the third embodiment of the present invention, and FIG. 11C shows the graph representing life times of variables in accordance with the third embodiment of the present invention; and FIG. 12 is a flowchart depicting the design evaluation method in accordance with the third embodiment of the present invention.

DETAILED DESCRIPTION OF THE INVENTION

Figure 1:
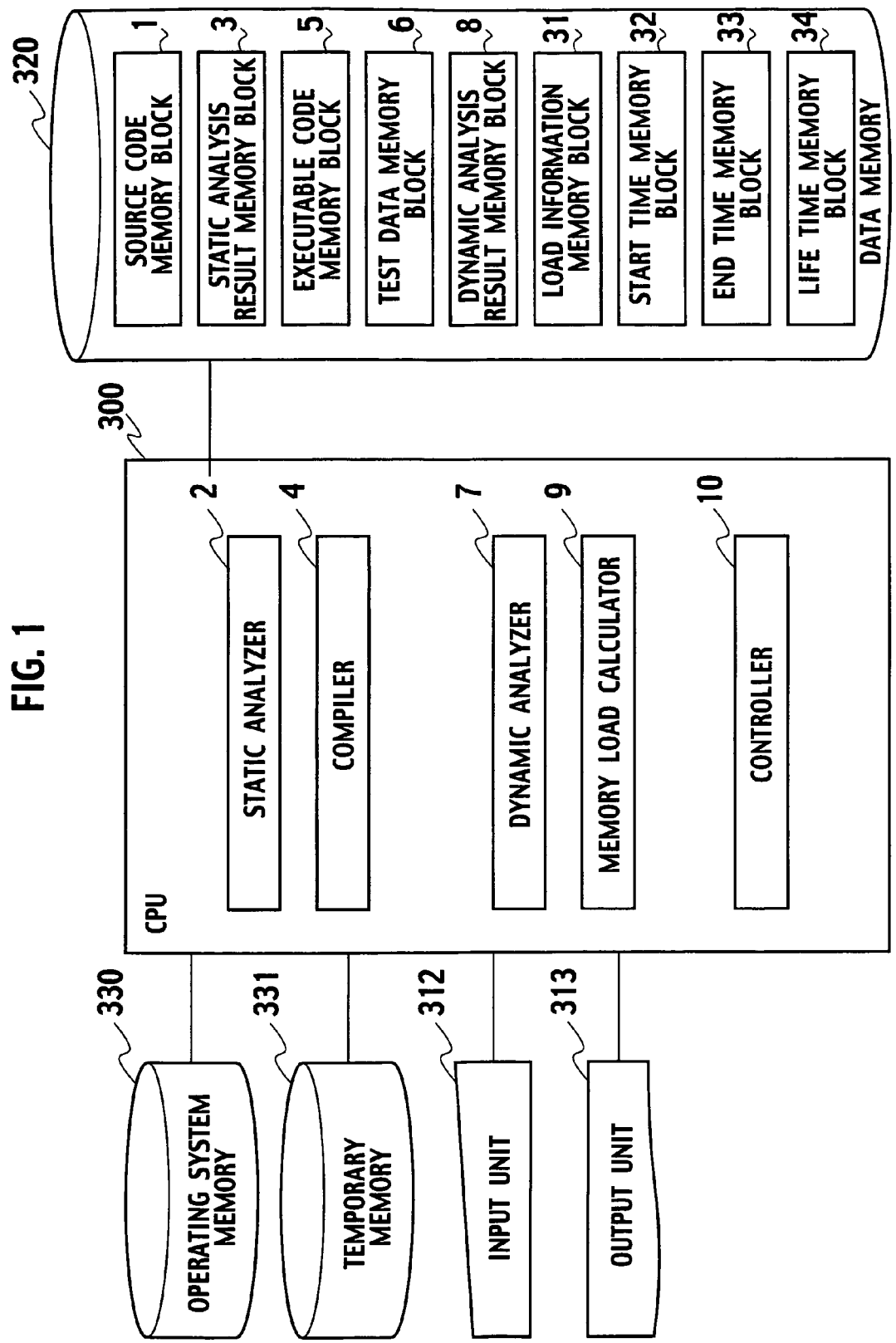
FIG. 1 is a block diagram of a design evaluation system for a system LSI in accordance with a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

With reference to FIG. 1, a design evaluation system according to a first embodiment of the present invention includes a central processing unit (CPU) 300. The CPU 300 contains a static analyzer 2 configured to analyze a source code by sampling a plurality of functions and a plurality of variables related to the functions from the source code, a compiler 4 configured to compile the source code into an executable code, a dynamic analyzer 7 configured to analyze each life start time and each life end time of the variables in case where the executable code is executed, and a memory load calculator 9 configured to calculate each memory load of the variables by multiplying each life time of the variables by each size of the variables, the life time being difference between the life start time and the life end time.

The static analyzer 2 is configured to statically analyze a source code written in an object-oriented language such as system C language. The program written in the object-oriented language includes a plurality of classes. As for the object-oriented language, module design is equivalent to designing the classes. Each of the classes includes a plurality of members, such as member variables, methods, variables to be referred to the methods, variables to be varied by the methods, and temporary variables defined in the methods. The methods are described as member functions, for example. Also, a constructor and a destructor may be included in each of the classes. The constructor is used to initialize data to be used in the class, for example. The destructor is used to cancel the data to be used in the class, for example. The source code also includes a main function and global variables. The main function is described in the first line of the source code. The global variables are defined for all classes and to be referred to and varied by any methods included in the source code.

The static analyzer 2 samples the member, the variables to be referred to the member, and the variables to be varied by the member in each class from the source code to generate a static analysis result as shown in FIG. 2. The static analysis result contains a column of a class name 11, a column of a member name 12, a column of a category 13, a column of a reference resource 14, a column of a resource to be varied 15, and a column of a temporary variable 16. Each name of the classes such as "A" and "B" is recorded in the column of the class name 11. Each name of the members such as "a", "set_a", "ret_a", "b", and "set_b" is recorded in the column of the member name 12. Each category of the members such as "variable" and "function" is recorded in the column of the category 13. Each variable or resource to be referred to the member such as "x.souce_of_a", "A", and "Z" is recorded in the column of the reference resources 14. Each variable or resource to be varied by the member such as "a" is recorded in the column of resource to be varied 15. In the case where such variable or resource does not exist, "not detected" is recorded in the column of resource to be varied 15. Each existence of the temporary variables is recorded such as "tmp" and "not detected" in the column of the temporary variables 16. The static analyzer 2 may adds each size of the member variables in each class to the static analysis result.

With reference again to FIG. 1, the compiler 4 is configured to compile the source code into an executable code. The compiler 4 uses a profiling function to embed information for dynamic analysis in the executable code.

The dynamic analyzer 7 is configured to execute the executable code by using a test data. Here, the combination of the executable code and the test data composes a "simulation model". Based on the result of the execution of the simulation model, the dynamic analyzer 7 abstracts each start time and end time of the methods contained in the executable code to generate a dynamic analysis result as shown in FIG. 3. The dynamic analysis result contains a column of an event generation time 18, a column of a function name 19, and a column of an event category 20. For example, the first record of the dynamic analysis result contains "0" as the event generation time 18, "main" as the function name 19, and the "start" as event category 20. The first record means that the main function starts at "0" time.

With reference again to FIG. 1, the memory load calculator 9 is configured to calculate a memory load to judge design quality of the simulation model, based on the static analysis result and the dynamic analysis result. The "memory load" is defined as follows. As for the global variables and the member variables defined outside function scopes, the memory load calculator 9 defines time when the function is first started to read or to vary the global variables or the member variables as "life start time". Also, the memory load calculator 9 defines time when the function is ended as "life end time". Further, the memory load calculator 9 defines the difference between the "life start time" and the "life end time" as "life time". As for the global variables given initial values, the memory load calculator 9 defines time when the main function or equivalent of the main function is first started as the "life start time". As for the member variables given the initial values and contained in the class, the memory load calculator 9 defines time when the constructor in the class is first started as the "life start time". When taking into account the object-oriented language which induces dynamic instance generation or disappearance, the dynamic analyzer 7 calculates the "life time" at the start time of the constructor and adds the "life time" to the total life time of the member variables in the class and delete the "life start time" even though the initial value is not assigned to the member variable. As for the temporary variables, the memory load calculator 9 defines time when the function defining the temporary variables is first started to read or to vary the temporary variables as "life start time". The dynamic analyzer 7 calculates the memory load by multiplying each size of variables by the life time. For example, the memory load of the class is defined as the following formula (1).

$$CMC = \sum_i MSi \times MTi + \sum_j \left( \sum_k MEj,k \times \sum_l TSj,l \right) \quad (1)$$

The memory load "CMC" is calculated by adding a "first sum of products" to a "second sum of products". Specifically, the "first sum of products" is the sum of products obtained by multiplying the size "MS" of the "i"-th member variable by the total life time "MT" of the "i"-th member variable. The "second sum of products" is the sum of products obtained by multiplying the sum of products of "k"-th execution time "ME" of the "j"-th member function by the sum of the size "TS" of the "l"-th temporary variable of the "j"-th member function.

The dynamic analyzer 7 calculates the memory load of the simulation model defined as the following formula (2).

$$MMC = \sum_i CMCi + \sum_j GSj \times GTj \quad (2)$$

The memory load "MMC" of the simulation model is calculated by adding the sum of products of the memory loads "CMC" of the class, which are calculated by using the formula (1), to the third sum of products obtained by multiplying the size of the "j"-th global variable "GS" by the life time of the "j"-th global variable "GT".

$$SMC = \sum_i Wi \times SCi \quad (3)$$

Formula (3) is used to calculate the memory load "SMC" of the classes calculated from the results of a plurality of simulation models executed by the memory load calculator 9. The memory load "SMC" of the classes is the sum of products obtained by multiplying "i"-th weight "W" assigned to the "i"-th simulation model by the "i"-th memory load "SC" of the "i"th simulation model.

For example, the dynamic analyzer 7 executes the plurality of simulation models by using the executable code and the various test data. The memory load calculator 9 calculates the total life time "MT" of member variables. The memory load calculator 9 calculates the memory load "SMC" of the classes by calculating the sum of products obtained by multiplying "i"-th weight "W" assigned to the "i"-th simulation model by the "i"-th memory load "SC".

The memory load calculator 9 can utilize the evaluation function defined as the formula (3), in order to determine individual memory load together from the results of the simulation models.

As for the weights "W" assigned to the memory load obtained from the results of the first to "i"-th simulation models, the memory load calculator 9 may, of course, calculate the first to "i"-th "W" in view of the probability of occurrence of events, the risk of impairment of LSI performance at the occurrence of events, or the like, due to test data which is used when the dynamic analyzer 7 performs the first to "i"th simulation models.

Although a weighted mean is taken as an example of the evaluation function, other approaches for calculation may be used to calculate the memory load.

The controller 10 is configured to control internal data transfer within the CPU 300 and data transfer with apparatuses connected to the CPU 300.

A data memory 320 is connected to the CPU 300. The data memory 320 contains a source code memory block 1, a static analysis result memory block 3, an executable code memory block 5, a test data memory block 6, a dynamic analysis result memory block 8, a start time memory block 32, an end time memory block 33, a life time memory block 34, and a load information memory block 31.

The source code memory block 1 is configured to store the source code to be simulated by the dynamic analyzer 7. The static analysis result memory block 3 is configured to store the static analysis result generated by the static analyzer 2. The executable code memory block 5 is configured to store the executable code complied by the compiler 4. The test data memory block 6 is configured to store the test data applied to the executable code executed by the dynamic analyzer 7. The dynamic analysis result memory block 8 is configured to store the dynamic analysis result generated by the dynamic analyzer 7.

The start time memory block 32 is configured to store the "life start time" sampled by the memory load calculator 9. The end time memory block 33 is configured to store the "life end time" sampled by the memory load calculator 9. The life time memory block 34 is configured to store the "life time" calculated by the memory load calculator 9. The load information memory block 31 is configured to store the memory load calculated by the memory load calculator 9.

With reference again to FIG. 1, an input unit 312, an output unit 313, an operating system memory 330, and a temporary memory 331 are also connected to the CPU 300. A keyboard, a mouse, and a touch panel may be used for the input unit 312. An LCD or an LED may be used for the output unit 313. The operating system memory 330 stores a program instructing the CPU 300 to transfer data with apparatuses connected to the CPU 300. The temporary memory 331 stores temporary data calculated during operation of the CPU 300. A hard disk, a magnetic disk, and an optical disk can be used for the operating system memory 330, With references next to FIGS. 4 to 8, a design evaluation method in accordance with the first embodiment is described.

In step ST10 of FIG. 4, the static analyzer 2 shown in FIG. 1 samples the functions and the variables related to the functions from the source code stored in the source code memory block 1. Thereafter, the static analyzer 2 generates the static analysis result shown in FIG. 2.

In step ST11, the compiler 4 reads the source code stored in the source code memory block 1. Then, the compiler 4 compiles the source code into the executable code. Thereafter, the compiler 4 stores the executable code in the executable code memory block 5.

In step ST12, the dynamic analyzer 7 reads the test data stored in the test data memory block 6 and the executable code stored in the executable code memory block 5. Then, the dynamic analyzer 7 executes the executable code by using the test data. Also, the dynamic analyzer 7 samples each life start time and each life end time of the variables. Thereafter, the dynamic analyzer 7 generates the dynamic analysis result shown in FIG. 3. The dynamic analyzer 7 stores the dynamic analysis result in the dynamic analysis result memory block 8.

In step ST13, the memory load calculator 9 calculates each life time of the variables based on the life start time and the life end time. Also, the memory load calculator 9 calculates each memory load of the variables by multiplying the life time by each size of the variables. Detail procedures in the step ST13 is described with reference to FIGS. 5 to 8.

Figure 5:
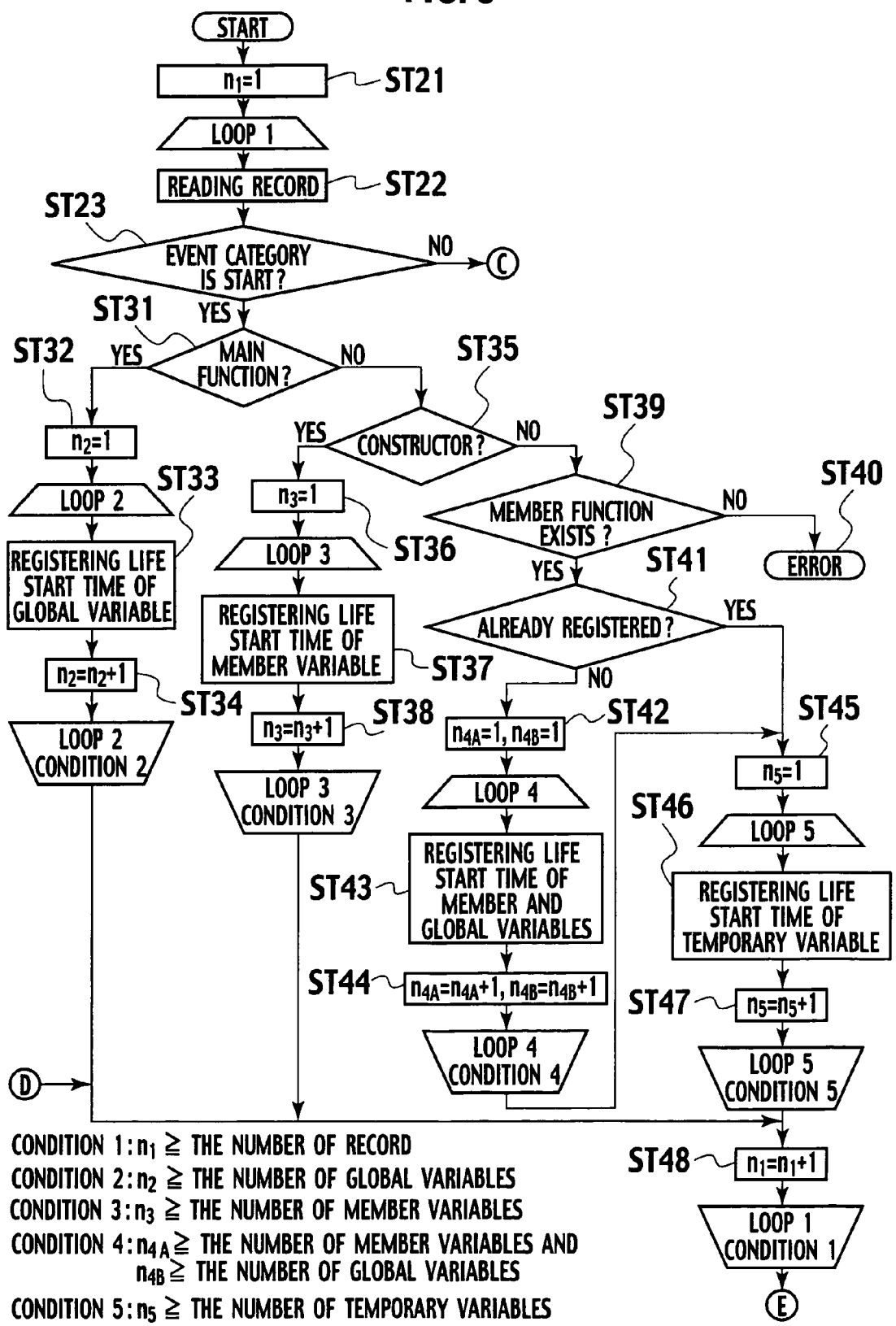
FIG. 5 is a second flowchart of a process for memory load calculation in accordance with the first embodiment of the present invention.
Figure 6:
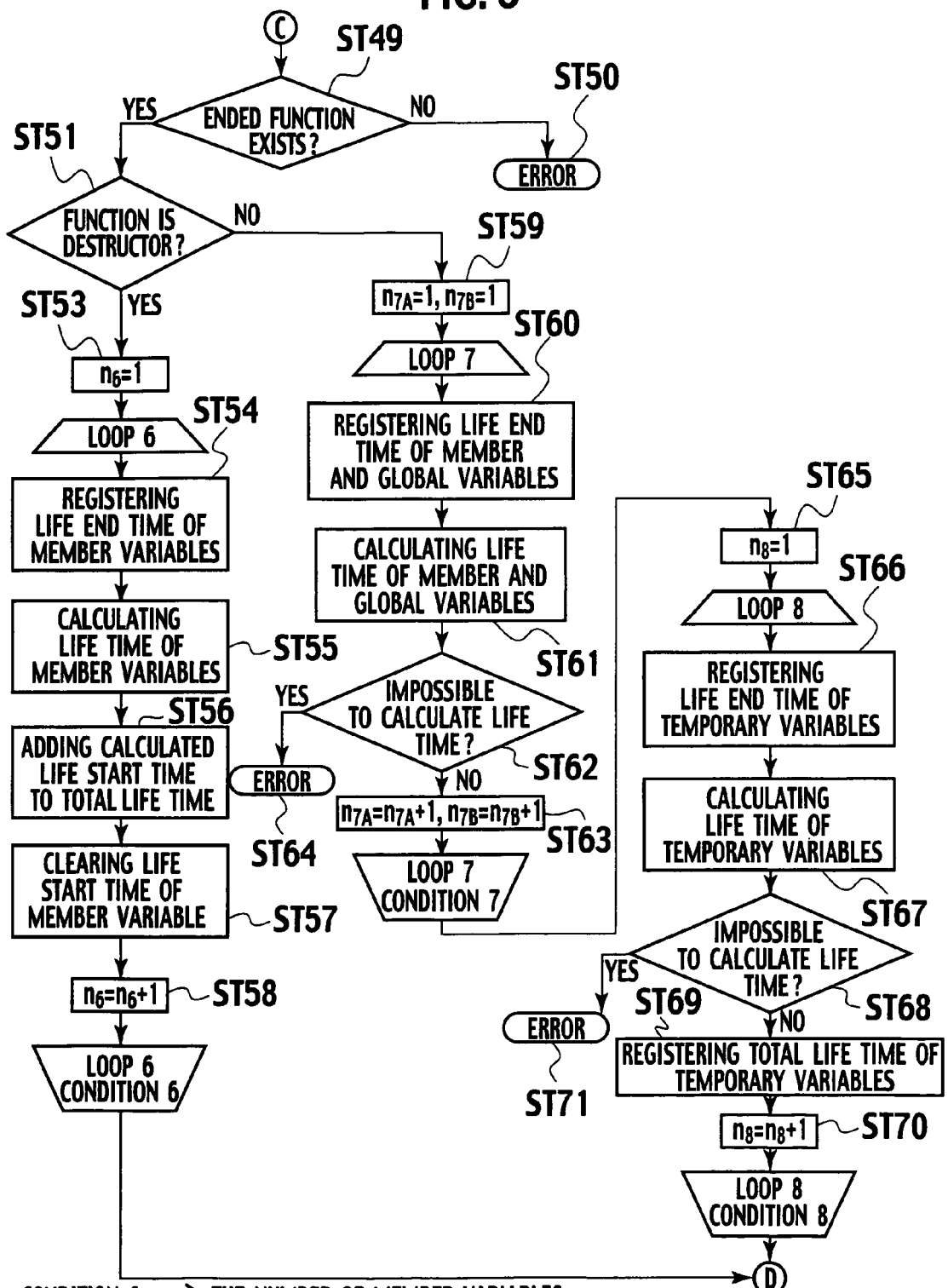
FIG. 6 is a third flowchart of the process for memory load calculation in accordance with the first embodiment of the present invention.

In step ST21 of FIG. 5, the memory load calculator 9 assigns one to an internal counting variable "$n_1$". In step ST22 in a first loop, the memory load calculator 9 reads "$n_1$"-th record of the dynamic analysis result shown in FIG. 3 from the dynamic analysis result memory block 8 shown in FIG. 1. In step ST23, the memory load calculator 9 determines whether the recorded event category 20 shown in FIG. 3 is the "start" or the "end". When the recorded event category is the "start", step ST31 is a next procedure. When the recorded event category is the "end", step ST49 of FIG. 6 is a next procedure.

In the step ST31 of FIG. 5, the memory load calculator 9 shown in FIG. 1 determines whether the recorded function name 19 shown in FIG. 3 is the "main" or not. When the recorded function name is the "main", step ST32 is a next procedure. When the recorded function name is not the "main", step ST35 is a next procedure.

In step ST32, the memory load calculator 9 shown in FIG. 1 assigns one to an internal counting variable "$n_2$". In step ST33 in a second loop, the memory load calculator 9 refers to the event generation time 18 shown in FIG. 3 to define the start time of the main function as the "life start time" of the "$n_2$"-th global variable that is given initial value. The memory load calculator 9 stores the "life start time" of the "$n_2$"-th global variable in the start time memory block 32 shown in FIG. 1. In step ST34, the memory load calculator 9 adds one to the internal counting variable "$n_2$". The memory load calculator 9 repeats procedures in the second loop until the internal counting variable "$n_2$" is above the number of global variables that are given initial values.

In step ST35, the memory load calculator 9 determines whether the recorded function is the constructor or not by reading the function name 19 shown in FIG. 3. When the recorded function is the constructor, step ST36 is a next procedure. When the recorded function is not the constructor, step ST39 is a next procedure.

In step ST36, the memory load calculator 9 shown in FIG. 1 assigns one to an internal counting variable "$n_3$". In step ST37 in a third loop, the memory load calculator 9 refers to the event generation time 18 shown in FIG. 3 to define the start time of the constructor as the "life start time" of the "$n_3$"-th member variable that is given initial value in the class where the constructor is defined. The memory load calculator 9 stores the "life start time" of the "$n_3$"-th member variable in the start time memory block 32.

In step ST38, the memory load calculator 9 shown in FIG. 1 adds one to the internal counting variable "$n_3$". The memory load calculator 9 repeats procedures in the third loop until the internal counting variable "$n_3$" is above the number of member variables that are given initial values. Here, the member variables are contained in the class where the constructor is defined.

In step ST39, the memory load calculator 9 reads the static analysis result that is shown in FIG. 2 and is stored in the static analysis result memory block 3 shown in FIG. 1. The memory load calculator 9 searches the column of the member name 12 of the static analysis result shown in FIG. 2 for the member function corresponding to the started function recorded in the column of the function name 19 shown in FIG. 3. When the member function does not recorded in the static analysis result, step ST40 is a next procedure and the method is suspended as an error end. When the member function is recorded in the static analysis result, step ST41 is a next procedure.

In the step ST41, the memory load calculator 9 shown in FIG. 1 verifies that the "life start time" of the member variables and the "life start time" of the global variables are already stored in the start time memory block 32. If the "life start times" of the member and global variables are not yet stored in the start time memory block 32, step ST42 is a next procedure. If the "life start times" of the member and global variables are already stored in the start time memory block 32, step ST45 is a next procedure.

In the step ST42, the memory load calculator 9 assigns one to an internal counting variable "$n_{4A}$" and an internal counting variable "$n_{4B}$", respectively. In step ST43 in a fourth loop, if the "$n_{4A}$"-th member variable to be varied in the member function exists, the memory load calculator 9 refers to the event generation time 18 shown in FIG. 3 to define the start time of the member function as the "life start times" of the "$n_{4A}$"-th member variable. The memory load calculator 9 stores "life start times" of the "$n_{4A}$"-th member variable in the start time memory block 32. If the "$n_{4B}$"-th global variable to be varied in the member function exists, the memory load calculator 9 shown in FIG. 1 refers to the event generation time 18 shown in FIG. 3 to define the start time of the member function as the "life start times" of the "$n_{4B}$"-th global variable. The memory load calculator 9 stores "life start times" of the "$n_{4B}$"-th global variable in the start time memory block 32.

In step ST44, if the "$n_{4A}$"-th member variable to be varied in the member function exists, the memory load calculator 9 shown in FIG. 1 adds one to the internal counting variable "$n_{4A}$". If the "$n_{4B}$"-th global variable to be varied in the member function exist, the memory load calculator 9 adds one to the internal counting variable "$n_{4B}$". The memory load calculator 9 repeats procedures in the fourth loop until the internal counting variable "$n_{4A}$" is above the number of member variables to be varied in the member function and the internal counting variable "$n_{4B}$" is above the number of global variables to be varied in the member function.

In the step ST45, the memory load calculator 9 assigns one to an internal counting variable "$n_5$". In step ST46 in a fifth loop, the memory load calculator 9 refers the event generation time 18 shown in FIG. 3 to define the start time of the member function as the "life start times" of the "$n_5$"-th temporary variable defined in the member function. The memory load calculator 9 stores the "life start times" of the "$n_5$"-th temporary variable in the start time memory block 32. In step ST47, the memory load calculator 9 adds one to the internal counting variable "$n_5$". The memory load calculator 9 repeats procedures in the fifth loop until the internal counting variable "$n_5$" is above the number of temporary variables defined in the member function.

In step ST48, the memory load calculator 9 adds one to the internal counting variable "$n_1$". The memory load calculator 9 repeats procedures in the first loop until the internal counting variable "$n_1$" is above the number of records in the dynamic analysis result shown in FIG. 3.

In the step ST49 of FIG. 6, the memory load calculator 9 reads the static analysis result that is shown in FIG. 2 and is stored in the static analysis result memory block 3 shown in FIG. 1. The memory load calculator 9 searches the column of the member name 12 of the static analysis result shown in FIG. 2 for the function corresponding to the ended function recorded in the column of the function name 19 shown in FIG. 3. When the function does not recorded in the static analysis result, step ST50 is a next procedure and the method is suspended as the error end. When the function is recorded in the static analysis result, step ST51 is a next procedure.

In the step ST51, the memory load calculator 9 determines whether the recorded function is the destructor or not by referring the function name 19 shown in FIG. 3. When the recorded function is the destructor, step ST55 is a next procedure. When the recorded function is not the destructor, step ST59 is a next procedure.

In the step ST53, the memory load calculator 9 assigns one to an internal counting variable "$n_6$". Also, the memory load calculator 9 assigns zero to a "total life time of the member variables". In step ST54 in a fifth loop, the memory load calculator 9 defines the end time of the function as the "life end time" of the "$n_6$"-th member variable. The memory load calculator 9 stores the "life end time" of the "$n_6$"-th member variable in the end time memory block 33. In step ST55, the memory load calculator 9 reads the "life start time" and the "life end time" of the "$n_6$"-th member variable stored in the start time memory block 32 and the end time memory block 33. Then, the memory load calculator 9 calculates the difference between the "life start time" and the "life end time" of the "$n_6$"-th member variable to obtain the "life time" of the "$n_6$"-th member variable.

In step ST56, the memory load calculator 9 adds the calculated "life time" to the "total life time of the member variables". The memory load calculator 9 stores the "total life time of the member variables" in the life time memory block 34. In step ST57, the memory load calculator 9 delete the stored "life start time" of the "$n_6$"-th member variable. In the step ST58, the memory load calculator 9 adds one to the internal counting variable "$n_6$". The memory load calculator 9 repeats procedures in the sixth loop until the internal counting variable "$n_6$" is above the number of member variables contained in the class where the destructor is defined.

In the step ST59, the memory load calculator 9 assigns one to an internal counting variable "$n_{7A}$" and an internal counting variable "$n_{7B}$", respectively. In step ST60 in a seventh loop, if the "$n_{7A}$"-th member variable to be referred to the function exists, the memory load calculator 9 defines the end time of the function as the "life end time" of the "$n_{7A}$"-th member variable. The memory load calculator 9 stores the "life end time" of the "$n_{7A}$"-th member variable in the end time memory block 33. If the "$n_7B$"-th global variable to be referred to the function exists, the memory load calculator 9 defines the end time of the function as the "life end time" of the "$n_{7B}$"-th global variable. The memory load calculator 9 stores the "life end time" of the "$n_{7B}$"-th global variable in the end time memory block 33.

In step ST61, if the "$n_{7A}$"-th member variable to be referred to the function exists, the memory load calculator 9 reads the "life start time" and the "life end time" of the "$n_{7A}$"-th member variable stored in the start time memory block 32 and the end time memory block 33. Then, the memory load calculator 9 calculates the difference between the "life start time" and the "life end time" of the "$n_{7A}$"-th member variable to obtain the "life time" of the "$n_{7A}$"-th member variable. The memory load calculator 9 stores the "life time" of the "$n_{7A}$"-th member variable in the life time memory block 34.

If the "$n_{7B}$"-th global variable to be referred to the function exists, the memory load calculator 9 reads the "life start time" and the "life end time" of the "$n_{7A}$"-th global variable stored in the start time memory block 32 and the end time memory block 33. Then, the memory load calculator 9 calculates the difference between the "life start time" and the "life end time" of the "$n_{7A}$"-th global variable to obtain the "life time" of the "$n_{7B}$"-th global variable. The memory load calculator 9 stores the "life time" of the "$n_{7B}$"-th global variable in the life time memory block 34.

In step ST62, the memory load calculator 9 verifies that the calculated "life time" is proper. For example, if the calculated "life time" is negative, the memory load calculator 9 determines that the calculated "life time" is improper. In this case, step ST64 is a next procedure and the method is suspended as the error end. In the case where the memory load calculator 9 determines the calculated "life time" is proper, step ST63 is a next procedure.

In the step ST63, the memory load calculator 9 adds one to each of the internal counting variable "$n_{7A}$" and the internal counting variable "$n_{7B}$". The memory load calculator 9 repeats procedures in the seventh loop until the internal counting variable "$n_{7A}$" is above the number of member variables referred to the function and the internal counting variable "$n_{7B}$" is above the number of global variables to be referred to the function.

In the step ST65, the memory load calculator 9 assigns one to an internal counting variable "$n_8$". Also, the memory load calculator 9 assigns zero to a "total life time of the temporary variables". In step ST66 in an eighth loop, the memory load calculator 9 defines the end time of the function as the "life end time" of the "$n_8$"-th temporary variable. The memory load calculator 9 stores the "life end time" of the "$n_8$"-th temporary variable in the end time memory block 33. In step ST67, the memory load calculator 9 reads the "life start time" and the "life end time" of the "$n_8$"-th temporary variable stored in the start time memory block 32 and the end time memory block 33. Then, the memory load calculator 9 calculates the difference between the "life start time" and the "life end time" of the "$n_8$"-th temporary variable to obtain the "life time" of the "$n_8$"-th temporary variable.

In step ST68, the memory load calculator 9 verifies that the calculated "life time" is proper. For example, if the calculated "life time" is negative, the memory load calculator 9 determines that the calculated "life time" is improper. In this case, step ST71 is a next procedure and the method is suspended as the error end. In the case where the memory load calculator 9 determines the calculated "life time" is proper, step ST69 is a next procedure.

In step ST69, the memory load calculator 9 adds the calculated "life time" to the "total life time of the temporary variables". Then, the memory load calculator 9 stores the "total life time of the temporary variables" in the life time memory block 34. In the step ST70, the memory load calculator 9 adds one to the internal counting variable "$n_8$". The memory load calculator 9 repeats procedures in the eighth loop until the internal counting variable "$n_8$" is above the number of temporary variables defined in the function.

Figure 7:
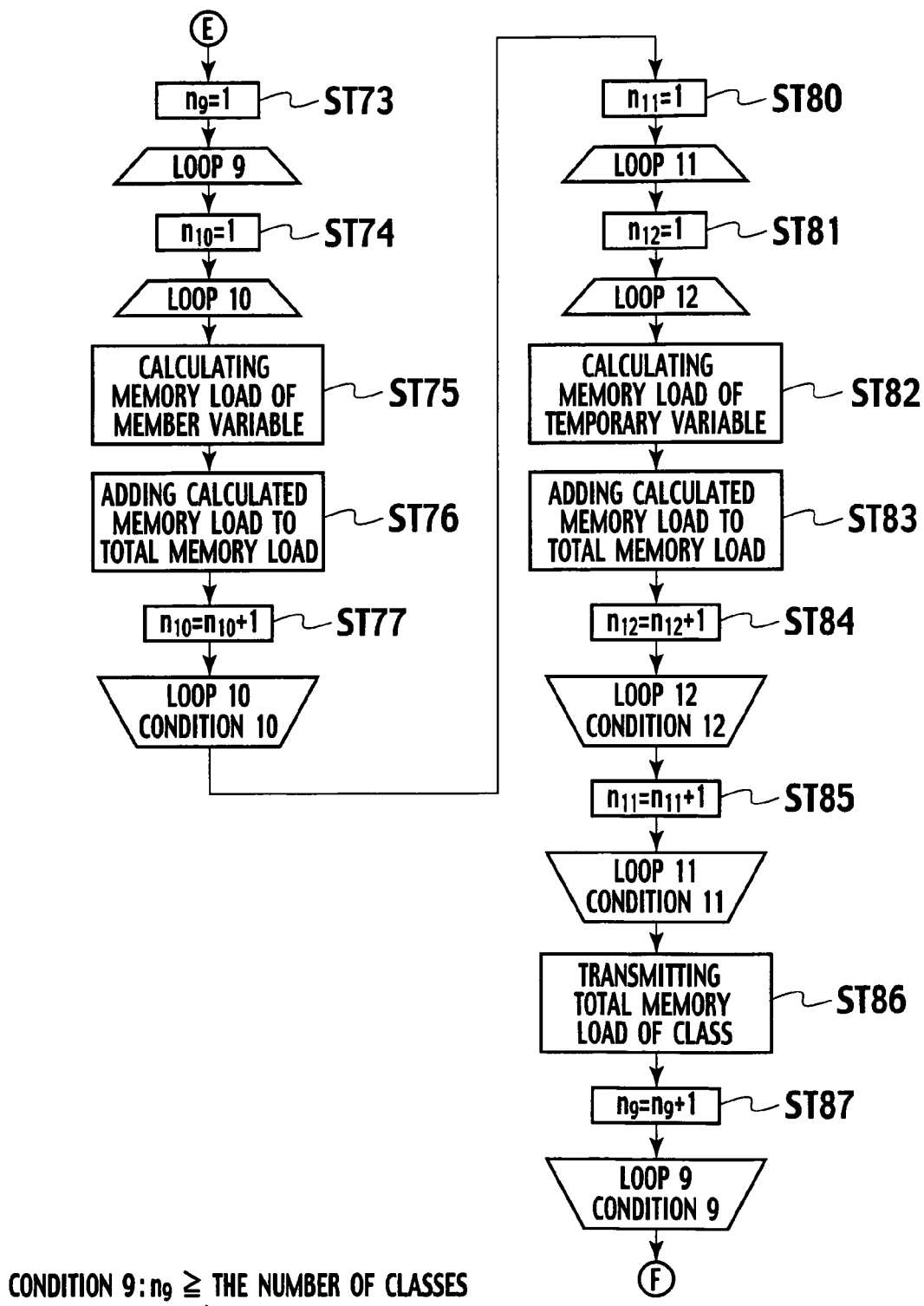
FIG. 7 is a fourth flowchart of the process for memory load calculation in accordance with the first embodiment of the present invention.

In step ST73 of FIG. 7, the memory load calculator 9 assigns one to an internal counting variable "$n_9$". In step ST74 in a ninth loop, the memory load calculator 9 assigns one to an internal counting variable "$n_{10}$". Also, the memory load calculator 9 assigns zero to a "total memory load of $n_9$-th class".

In step ST75 in a tenth loop, the memory load calculator 9 reads the "life time" of the "$n_{10}$"-th member variable in the "$n_9$"-th class stored in the life time memory block 34. Then, the memory load calculator 9 calculates the "memory load" of the "$n_{10}$"-th member variable in the "$n_9$"-th class by multiplying the size of the "$n_{10}$"-th member variable in the "$n_9$"-th class by the "life time" of the "$n_{10}$"-th member variable in the "$n_9$"-th class. In step ST76, the memory load calculator 9 adds the calculated "memory load" of the "$n_{10}$"-th member variable in the "$n_9$"-th class to the "total memory load of $n_9$-th class". In step ST77, the memory load calculator 9 adds one to the internal counting variable "$n_{10}$". The memory load calculator 9 repeats procedures in the tenth loop until the internal counting variable "$n_{10}$" is above the number of member variables contained in the $n_9$-th class.

In step ST80, the memory load calculator 9 assigns one to an internal counting variable "$n_{11}$". In step ST81 in an eleventh loop, the memory load calculator 9 assigns one to an internal counting variable "$n_{12}$". In step ST82 in a twelfth loop, the memory load calculator 9 reads the "total life time" of the "$n_{12}$"-th temporary variable defined in the "$n_{11}$"-th member function contained in the "$n_9$"-th class stored in the life time memory block 34. Then, the memory load calculator 9 calculates the "memory load" of the "$n_{12}$"-th temporary variable defined in the "$n_{11}$"-th member function contained in the "$n_9$"-th class by multiplying the size of the "$n_{12}$"-th temporary variable defined in the "$n_{11}$"-th member function contained in the "$n_9$"-th class by the "total life time" of the "$n_{12}$"-th temporary variable defined in the "$n_{11}$"-th member function contained in the "$n_9$"-th class.

In step ST83, the memory load calculator 9 adds the calculated "memory load" of the "$n_{12}$"-th temporary variable defined in the "$n_{11}$"-th member function contained in the "$n_9$"-th class to the "total memory load of $n_9$-th class". In step ST84, the memory load calculator 9 adds one to the internal counting variable "$n_{12}$". The memory load calculator 9 repeats procedures in the twelfth loop until the internal counting variable "$n_{12}$" is above the number of temporary variables defined in the "$n_{11}$"-th member function contained in the "$n_9$"-th class.

In step ST85, the memory load calculator 9 adds one to the internal counting variable "$n_{11}$". The memory load calculator 9 repeats procedures in the eleventh loop until the internal counting variable "$n_{11}$" is above the number of the member functions contained in the "$n_9$"-th class.

In step ST86, the memory load calculator 9 stores the "total memory load of $n_9$-th class" in the load information memory block 31. Here, the "total memory load of $n_9$-th class" is equivalent to the value calculated by the formula (1). In step ST87, the memory load calculator 9 adds one to the internal counting variable "$n_9$". The memory load calculator 9 repeats procedures in the ninth loop until the internal counting variable "$n_9$" is above the number of the classes.

Figure 8:
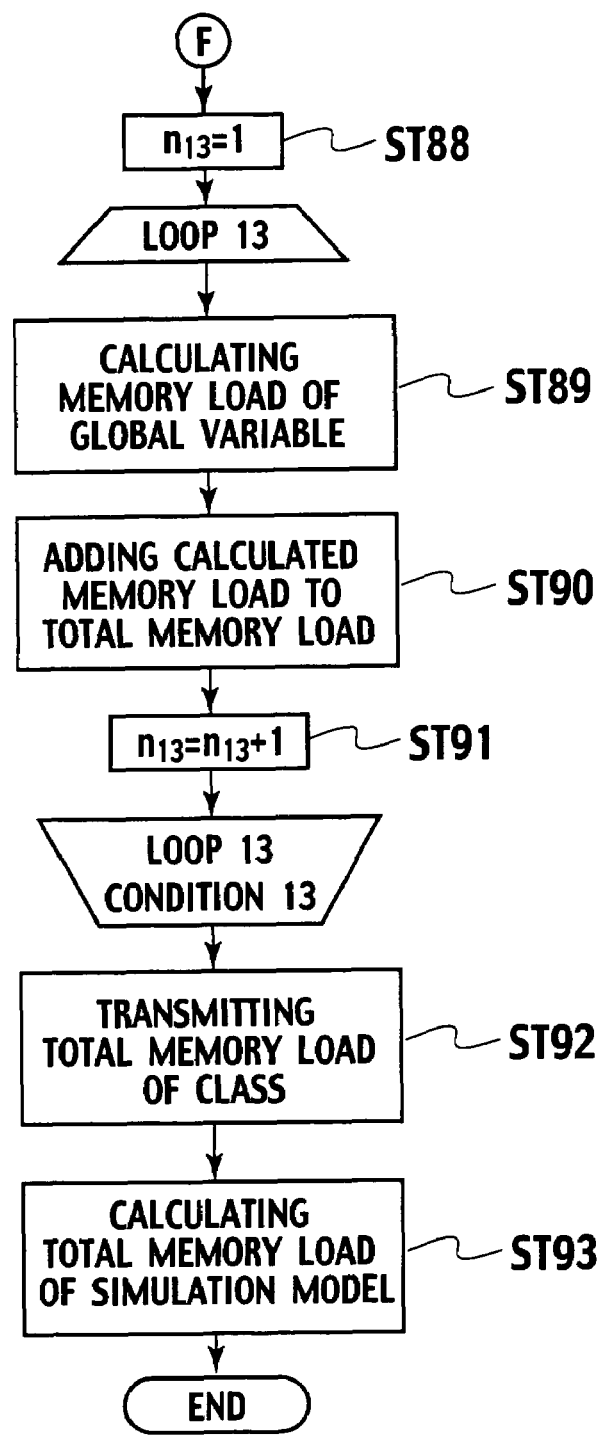
FIG. 8 is a fifth flowchart of the process for memory load calculation in accordance with the first embodiment of the present invention.

In step ST88 of FIG. 8, the memory load calculator 9 assigns one to an internal counting variable "$n_{13}$". Also, the memory load calculator 9 assigns zero to a "total memory load of global variables". In step ST89 in a thirteenth loop, the memory load calculator 9 reads the "life time" of the "$n_{13}$"-th global variable stored in the life time memory block 34. Then, the memory load calculator 9 calculates the "memory load" of the "$n_{13}$"-th global variable by multiplying the size of the "$n_{13}$"-th global variable by the "life time" of the "$n_{13}$"-th global variable. In step ST90, the memory load calculator 9 adds the calculated "memory load" of the "$n_{13}$"-th global variable to the "total memory load of global variables". In step ST91, the memory load calculator 9 adds one to the internal counting variable "$n_{13}$". The memory load calculator 9 repeats procedures in the thirteenth loop until the internal counting variable "$n_{13}$" is above the number of the global variables.

In step ST92, the memory load calculator 9 stores the "total memory load of global variables" in the load information memory block 31. In step ST93, the memory load calculator 9 reads the "each total memory load of the first to last classes" stored in the load information memory block 31 and sums up a "total memory load of all classes". Thereafter, the memory load calculator 9 reads the "total memory load of global variables" stored in the load information memory block 31. The memory load calculator 9 calculates the "total memory load of the simulation model" by adding the "total memory load of global variables" to the "total memory load of all classes". Then, the memory load calculator 9 stores the "total memory load of the simulation model" in the load information memory block 31.

Second Embodiment

Figures 9A, 9B, 9C:
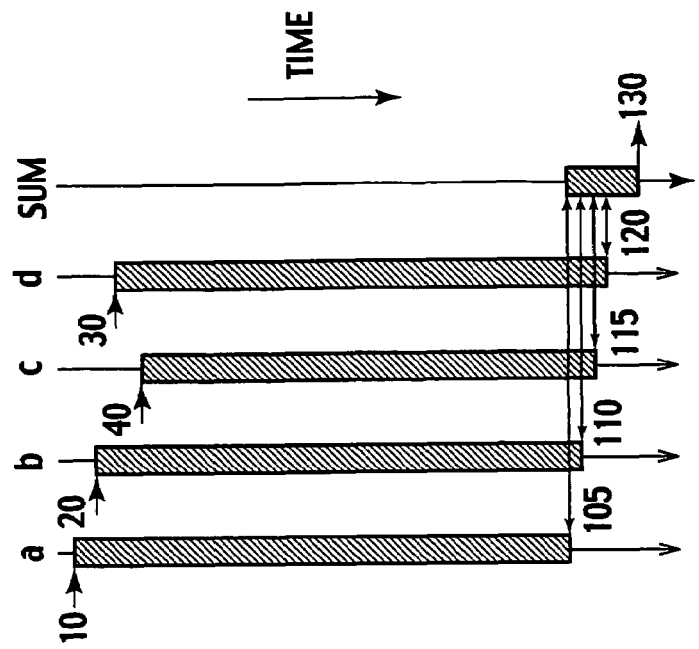
FIG. 9A shows an example description of a class source in accordance with a second embodiment of the present invention.
FIG. 9B shows an example description of a class sum in accordance with the second embodiment of the present invention.
FIG. 9C shows a graph representing life times of variables in accordance with the second embodiment of the present invention.
Figure 10:
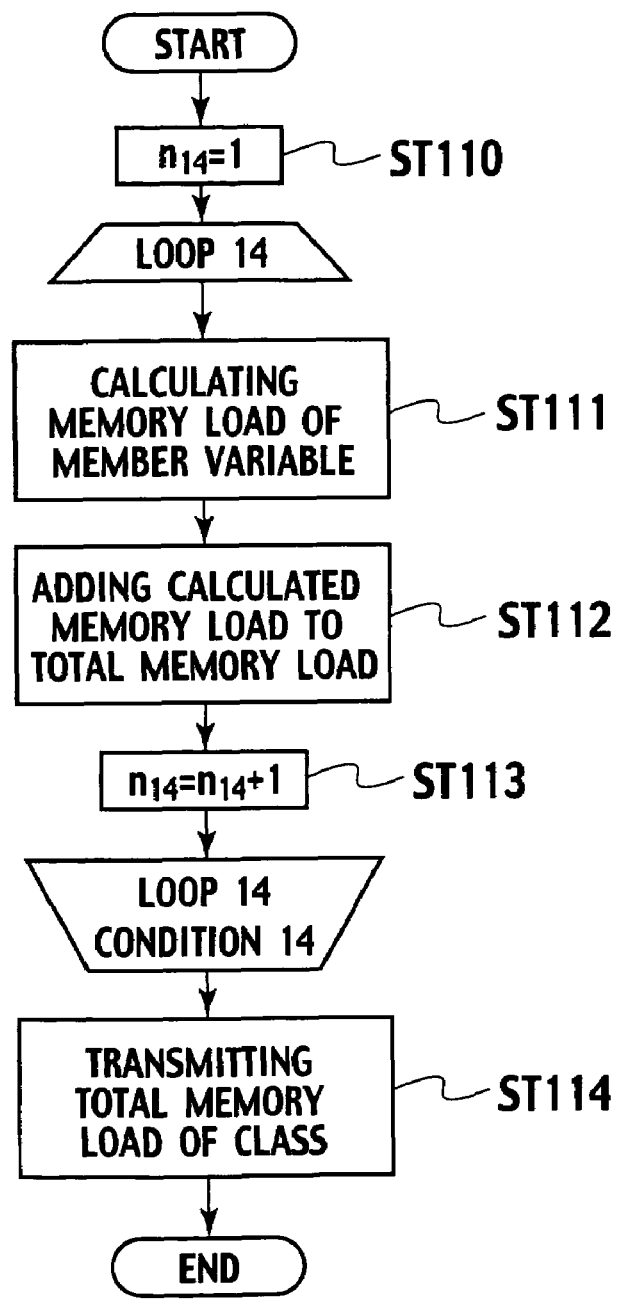
FIG. 10 is a flowchart depicting the design evaluation method in accordance with the second embodiment of the present invention.

FIGS. 9A to 9C show a process for memory load calculation which is performed by the design evaluation system for LSI according to a second embodiment of the present invention. FIG. 10 is a flowchart showing the design evaluation method for the system LSI according to the second embodiment of the present invention. The description is given with regard to the flow of operation for assisting in design according to the second embodiment with reference to FIG. 1, FIGS. 9A to 9C, and the flowchart of FIG. 10.

Here, the source code memory block 1 stores a class source 91 shown in FIG. 9A being equivalent to the module, and a class sum 92 shown in FIG. 9B. As shown in FIG. 9A, the class source 91 contains private member variables "a", "b", "c", and "d" defined within the source code. The test data memory block 6 shown in FIG. 1 stores the test data which is used for the dynamic analyzer 7 to calculate the sum of the member variables "a", "b", "c", and "d" using the class sum 92 shown in FIG. 9B which is activated asynchronously with the class source 91 shown in FIG. 9A.

The dynamic analyzer 7 operates to asynchronously cause events, which set the values of the member variables "a", "b", "c", and "d", and to avoid the events from being activated simultaneously.

The dynamic analyzer 7 reads out the class source 91 from the source code memory block 1 and the test data for the class source 91 from the test data memory block 6, sets the values of the member variables "a", "b", "c", and "d", and retains the set values. Also, the dynamic analyzer 7 reads out the class sum 92 from the source code memory block 1 and retains the set values.

The dynamic analyzer 7 executes the simulation model, which involves polling individual classes of the class sum 92 asynchronously activated, acquiring the values of the member variables "a", "b", "c", and "d", and calculating the sum of the member variables "a", "b", "c", and "d".

For example, the dynamic analyzer 7 polls the class source 91 related to the member variable "a", and the memory load calculator 9 stores the life start time "10" of the function written as "seta" and the life end time "105" of the function written as "seta" as shown in FIG. 9C in the start time memory block 32 and the end time memory block 33. The dynamic analyzer 7 polls the class source 91 related to the member variable "b", and the memory load calculator 9 stores the life start time "20" of the function written as "setb" and the life end time "110" of the function written as "setb" in the start time memory block 32 and the end time memory block 33. In the same manner, the dynamic analyzer 7 polls the class source 91 related to the member variable "c", and the memory load calculator 9 stores the life start time "40" of the function written as "setc" and the life end time "115" of the function written as "setc" in the start time memory block 32 and the end time memory block 33. The dynamic analyzer 7 polls the class source 91 related to the member variable "d", and the memory load calculator 9 stores the life start time "30" of the function written as "setd" and the life end time "120" of the function written as "setd" in the start time memory block 32 and the end time memory block 33.

At the life end time of each member variable of the class source 91, the dynamic analyzer 7 activates the class sum 92, and the memory load calculator 9 calculates the life time of the member variable, in the class sum 92. For example, for the member variable "a" shown in FIG. 9C, the dynamic analyzer 7 activates the "reta" in the class sum 92 shown in FIG. 9B at the time "105". For the member variable "b" shown in FIG. 9C, the dynamic analyzer 7 activates the "retb" in the class sum 92 shown in FIG. 9B at the time "110". For the member variable "c" shown in FIG. 9C, the dynamic analyzer 7 activates the "retc" in the class sum 92 shown in FIG. 9B at the time "115". For the member variable "d" shown in FIG. 9C, the dynamic analyzer 7 activates the "retd" in the class sum 92 shown in FIG. 9B at the life start time "120".

The dynamic analyzer 7 completes all executions of the class sum 92. The life end time of the class sum 92 is "130" as shown in FIG. 9C. The memory load calculator 9 stores the life start time "105" of the variable "sum" of the class sum 92 in the start time memory block 32. Also, the memory load calculator 9 stores the life end time "130" of the variable "sum" of the class sum 92 in the end time memory block 33.

The memory load calculator 9 reads each "life start time" of the member variables "a"-"d" from the start time memory block 32. Also, the memory load calculator 9 reads each "life end time" of the member variables "a"-"d" from the end time memory block 33. Then, the memory load calculator 9 calculates each life time of the member variables "a"-"d" in the class source 91. The memory load calculator 9 stores each life time of the member variables "a"-"d" in the life time memory block 34.

The memory load calculator 9 reads the "life start time" of the variable "sum" from the start time memory block 32. Also, the memory load calculator 9 reads the "life end time" of the variable "sum" from the end time memory block 33. Then, the memory load calculator 9 calculates the life time of the variable "sum" in the class sum 92. The memory load calculator 9 stores the calculated life time of the variable "sum" in the life time memory block 34.

In step ST110, the memory load calculator 9 assigns one to an internal counting variable "$n_{14}$". Also, the memory load calculator 9 assigns "0" to the "total memory load".

In step ST111 in a fourteenth loop, the memory load calculator 9 reads the "life time" of the "$n_{14}$"-th member variable stored in the life time memory block 34. Then, the memory load calculator 9 calculates the "memory load" of the "$n_{14}$"-th member variable in the class from the product of the size of the "$n_{14}$"-th member variable in the class and the "life time" of the "$n_{14}$"-th member variable in the class. For example when the first member variable is "a" and the member variable "a" is "4 bytes" in size, the memory load calculator 9 obtains the memory load "380" by multiplying the life time "95" of the variable "a" by "4 bytes". When the second member variable is "b" and the member variable "b" is "4 bytes" in size, the memory load calculator 9 obtains the memory load "360" by multiplying the life time "90" of the variable "b" by "4 bytes". When the third member variable is "c" and the member variable "c" is "4 bytes" in size, the memory load calculator 9 obtains the memory load "300" by multiplying the life time "75" of the variable "b" by "4 bytes". When the fourth member variable is "d" and the member variable "d" is "4 bytes" in size, the memory load calculator 9 obtains the memory load "360" by multiplying the life time "90" of the variable "b" by "4 bytes". It should be noted that a unit which is identical or proportional to the machine cycle of a system LSI can be used as the life time of the variable. In the second embodiment, a numeric value relatively indicating a difference between the life times of the member variables of each class is used as the life time of the variable. The output unit 313 may provide a bar graph shown in FIG. 9C. Specifically, a display screen displays the graph, or a printer produces printed output of the graph. The bar graph is advantageous to system LSI designers, in that the designers can visually recognize the memory load because the area of the bar increases in proportion to the memory load.

In step ST112, the memory load calculator 9 adds the memory load of the "$n_{14}$"-th member variable to the "total memory load". When the "$n_{14}$"-th member variable is the variable "a", the memory load calculator 9 adds "380" to the "total memory load". When the "$n_{14}$"-th member variable is the variable "b", the memory load calculator 9 adds "360" to the "total memory load". When the "$n_{14}$"-th member variable is the variable "c", the memory load calculator 9 adds "300" to the "total memory load". When the "$n_{14}$"-th member variable is the variable "d", the memory load calculator 9 adds "360" to the "total memory load".

In step ST113, the memory load calculator 9 adds one to the internal counting variable "$n_{14}$". The memory load calculator 9 repeats procedures in the fourteenth loop until the internal counting variable "$n_{14}$" is above the number of member variables that are defined in the class source 91.

In step ST114, after the polling of all the member variables "a" to "d" and the calculation of the memory loads of all the member variables are completed, the memory load calculator 9 reads the "life time" of the variable "sum" stored in the life time memory block 34. Then, the memory load calculator 9 obtains the memory load "100" of the variable "sum" by multiplying the life time "25" of the variable "sum" by 4 bytes, and adds the memory load "100" to the total memory load. Here, "the total memory load" according to the second embodiment is "1500". Then, the memory load calculator 9 transmits the total memory load of the class to the output unit 313 via the controller 10.

Table 1 shows the cycle of the life time of each of the four variables "a" to "d", the size of each variable, and the load of each variable.

TABLE 1

| Life time (Active) | Cycle | Size | Load |
| --- | --- | --- | --- |
| Variable a | 95 | 4 bytes | 380 |
| Variable b | 90 | 4 bytes | 360 |
| Variable c | 75 | 4 bytes | 300 |
| Variable d | 90 | 4 bytes | 360 |
| Variable sum | 25 | 4 bytes | 100 |

By referring to the second embodiment, the description has been given with regard to the memory load calculator 9 as configured to add the calculated memory load of each variable to the total memory load. However, the second embodiment of the present invention is not limited to such configuration. The memory load calculator 9 may be configured to transmit each memory load of the variables to the output unit 313 via the controller 10.

The memory load calculator 9 may transmit only the total memory load "1500", which is obtained by calculating the sum of the memory loads of the variables, to the controller 10. Alternatively, the memory load calculator 9 may allow the load information memory block 31 to store the total memory load "1500" or the memory loads of the variables.

Third Embodiment

FIGS. 11A to 11C show a process for memory load calculation which is performed by the design evaluation system for the system LSI according to a third embodiment of the invention. FIG. 12 shows the design evaluation method for the system LSI according to the third embodiment of the invention. The description is given with regard to the flow of the design evaluation system according to the third embodiment with reference to FIG. 1, FIGS. 11A to 11C, and the flowchart of FIG. 12. As for the same structural components as the structural components of the second embodiment, the repeated description of the same structural components is omitted.

The dynamic analyzer 7 according to the third embodiment is different in configuration from the dynamic analyzer 7 of the second embodiment. At the completion of setting of each value of the member variables "a", "b", "c", and "d" in each class contained in a class source 91a shown in FIG. 11A, the dynamic analyzer 7 informs a class sum 92a shown in FIG. 11B of the each value of the member variables "a", "b", "c", and "d". At the completion of asynchronous activation of the class sum 92a shown in FIG. 11B, the dynamic analyzer 7 transmits the dynamic analysis result 8, which indicates the life time of the corresponding member variable, to the memory load calculator 9.

The memory load calculator 9 stores the life start time "10" shown in FIG. 11C in the start time memory block 32. The start time "10" corresponds to the life start time of the function written as "seta" in the class source 91a related to the member variable "a" shown in FIG. 11A. Also, the memory load calculator 9 stores the life end time "15" of the "seta" shown in FIG. 11C in the end time memory block 33. Then, the memory load calculator 9 reads the "life start time" and "life end time" of the "seta" stored in the start time memory block 32 and the end time memory block 33. Thereafter, the memory load calculator 9 calculates the "life time" of the member variable "a" that is difference between the "life start time" and the "life end time" of the "seta". Here, the "life time" of the member variable "a" is "5".

The memory load calculator 9 stores the life start time "15" of the "SUM.add(a)" of the class source 91a in the start time memory block 32. At the start time of the "SUM.add (a)" shown in FIG. 11C corresponding to member variable "a" of the class source 91a shown in FIG. 11A, the dynamic analyzer 7 activates the class sum 92a shown in FIG. 11B. The memory load calculator 9 stores the life start time "15" of the variable "sum" of the class sum 92a in the start time memory block 32. The memory load calculator 9 stores the life end time "18" of the "SUM.add(a)" of the class source 91a in the end time memory block 33.

The memory load calculator 9 reads the life start time "15" of the "SUM.add(a)" and the life end time "18" of the "SUM.add(a)" stored in the start time memory block 32 and the end time memory block 33, respectively. Since the dynamic analyzer 7 activates "add(tmp)" of the class sum 92a at the start time "15" of the "SUM.add(a) and the life time of "add(tmp)" in the class sum 92a shown in FIG. 11B corresponds to the use time of a variable "tmp", the time between the time "15" and the time "18" shown in FIG. 11C corresponds to the life time "3" of the variable "tmp". The memory load calculator 9 stores the calculated "life time" of the variable "tmp" in the life time memory block 34.

The memory load calculator 9 stores the life start time "20" shown in FIG. 11C in the start time memory block 32. The start time "20" corresponds to the start time of the function written as "setb" in the class source 91a related to the member variable "b" shown in FIG. 11A. Then, the memory load calculator 9 stores the life end time "25" of the "setb" in the end time memory block 33. Thereafter, the memory load calculator 9 reads the "life start time" and the "life end time" of the "setb" stored in the start time memory block 32 and the end time memory block 33. The memory load calculator 9 calculates the "life time" of the variable "b" that is difference between the "life time" of the variable "b" that "life end time" of the "setb". Here, the "life time" of the variable "b" is "5". The memory load calculator 9 stores the "life time" of the variable "b" in the life time memory block 34.

The memory load calculator 9 stores the life start time "25" of the "add(tmp)" in the start time memory block 32. Also, the memory load calculator 9 stores the life end time "28" of the "add(tmp)" in the end time memory block 33. Then, the memory load calculator 9 reads the "life start time" and the "life end time" of the "add(tmp)" stored in the start time memory block 32 and the end time memory block 33. The dynamic analyzer 7 calculates and stores the life time "3" of the variable "tmp" in the life time memory block 34.

The memory load calculator 9 stores the life start time "30" shown in FIG. 11C in the start time memory block 32. The start time "30" corresponds to the start time of the function written as "setc" in the class source 91a related to the member variable "c" shown in FIG. 11A. Then, the memory load calculator 9 stores the life end time "35" of the "setc" in the end time memory block 33. Thereafter, the memory load calculator 9 reads the "life start time" and the "life end time" of the variable "c" that in the start time memory block 32 and the end time memory block 33. The memory load calculator 9 calculates the "life time" of the variable "c" that is difference between the "life start time " and the "life end time" of the "setc". Here, the "life time" of the variable "c" is "5". The memory load calculator 9 stores the "life time" of the variable "c" in the life time memory block 34.

The memory load calculator 9 stores the life start time "35" of the "add(tmp)" in the start time memory block 32. Also, the memory load calculator 9 stores the life end time "38" of the "add(tmp)" in the end time memory block 33. Then, the memory load calculator 9 reads the "life start time" and the "life end time" of the "add(tmp)" stored in the start time memory block 32 and the end time memory block 33. The dynamic analyzer 7 calculates and stores the life time "3" of the variable "tmp" in the life time memory block 34.

The memory load calculator 9 stores the life start time "40" shown in FIG. 11C in the start time memory block 32. The start time "40" corresponds to the start time of the function written as "setd" in the class source 91a related to the member variable "d" shown in FIG. 11A. Then, the memory load calculator 9 stores the life end time "45" of the "setd" in the end time memory block 33. Thereafter, the memory load calculator 9 reads the "life start time" and the "life end time" of the "setd" stored in the start time memory block 32 and the end time memory block 33. The memory load calculator 9 calculates the "life time" of the variable "d" that is difference between the "life start time" and the "life end time" of the "setd". Here, the "life time" of the variable "d" is "5". The memory load calculator 9 stores the "life time" of the variable "d" in the life time memory block 34.

The memory load calculator 9 stores the life start time "45" of the "add (tmp)" in the start time memory block 32. Also, the memory load calculator 9 stores the life end time "48" of the "add(tmp)" in the end time memory block 33. Then, the memory load calculator 9 reads the "life start time" and the "life end time" of the "add(tmp)" stored in the start time memory block 32 and the end time memory block 33. The dynamic analyzer 7 calculates and stores the life time "3" of the variable "tmp" in the life time memory block 34.

Until the time "130" when the class sum 92a ends, the memory load calculator 9 sum up the life time of the variable "tmp" corresponding to each member variable to obtain the total life time of the variable "tmp". Here, the "total life time" of the variable "tmp" is "12". Also, the memory load calculator 9 stores the life end time "130" of the variable "sum" of the class sum 92a in the end time memory block 33. Then, the memory load calculator 9 reads the "life start time" and the "life end time" of the variable "sum" stored in the start time memory block 32 and the end time memory block 33. Thereafter, the memory load calculator 9 calculates the "life time" of the variable "sum". Here, the "life time" of the variable "sum" is "115". The memory load calculator 9 stores the "life time" of the variable "sum" in the life time memory block 34.

In step ST120 of FIG. 12, the memory load calculator 9 assigns one to an internal counting variable "$n_{15}$". Also, the memory load calculator 9 assigns "0" to the "total memory load". In step ST121 in a fifteenth loop, the memory load calculator 9 reads the "life time" of the "$n_{15}$"-th member variable stored in the life time memory block 34. Then, the memory load calculator 9 calculates the "memory load" of the "$n_{15}$"-th member variable in the class from the product of the size of the "$n_{15}$"-th member variable in the class and the "life time" of the "$n_{15}$"-th member variable in the class. For example when all the member variables are each 4 bytes in size, the memory load calculator 9 obtains the memory load "20" by multiplying the life time "5" of the member variable "a" by 4 bytes. If the "$n_{15}$"-th member variable is the member variable "b", the memory load calculator 9 obtains the memory load "20" by multiplying the life time "5" of the member variable "b" by 4 bytes. If the "$n_{15}$"-th member variable is the member variable "c", the memory load calculator 9 obtains the memory load "20" by multiplying the life time "5" of the member variable "c" by 4 bytes. If the "$n_{15}$"-th member variable is the member variable "d", the memory load calculator 9 obtains the memory load "20" by multiplying the life time "5" of the member variable "d" by 4 bytes.

In step ST122, the memory load calculator 9 adds the "memory load" of the "$n_{15}$"-th member variable to the "total memory load". If the "$n_{15}$"-th member variable is the member variable "a", the memory load calculator 9 adds "20" as the "memory load" of the member variable "a" to the "total memory load". If the "$n_{15}$"-th member variable is the member variable "b", the memory load calculator 9 adds "20" as the "memory load" the member variable "b" to the "total memory load". If the "$n_{15}$" th member variable is the member variable "c", the memory load calculator 9 adds "20" as the "memory load" the member variable "c" to the "total memory load". If the "$n_{15}$"-th member variable is the member variable "d", the memory load calculator 9 adds "20" as the "memory load" the member variable "d" to the "total memory load".

In step ST123, the memory load calculator 9 adds one to the internal counting variable "$n_{15}$" The memory load calculator 9 repeats procedures in the fifteenth loop until the internal counting variable "$n_{15}$" is above the number of member variables that are defined in the class source 91a.

In step ST124, the memory load calculator 9 reads the "life time" of the variable "tmp" stored in the life time memory block 34. Then, the memory load calculator 9 obtains the memory load "48" of the variable "tmp" by multiplying the total life time "12" of the variable "tmp" by 4 bytes, and adds the memory load "48" to the "total memory load". Next, the memory load calculator 9 reads the "life time" of the variable "sum" stored in the life time memory block 34. Then, the memory load calculator 9 obtains the memory load "460" of the variable "sum" by multiplying the life time "115" of the variable "sum" by 4 bytes, and adds the memory load "460" to the "total memory load". Here, "the total memory load" is "588". Then, the memory load calculator 9 transmits the total memory load of the class to the output unit 313 via the controller 10.

Here, the third embodiment of the invention has the advantage of reducing the total memory load by as much as 32.9%, as compared to the second embodiment. When a system LSI subjected to the process for memory load calculation of the second embodiment undergoes high-level synthesis, a central processing unit asynchronously produces the setting of the variables "a" to "d" and the polling of the values from SUM. Thus, dedicated memories or registers are assigned to the variables "a" to "d" during all the time when the class source 91 operates. On the other hand, when a system LSI subjected to the process for memory load calculation of the third embodiment undergoes high-level synthesis, the central processing unit does not simultaneously produce the start of the functions of the events "seta" to "setd" which set the variables "a" to "d". Therefore, the central processing unit of the system LSI can complete the setting of the variables "a" to "d", the calling of SUM.add, and the add execution in one cycle each. Thus, the memories or registers can hold the variables "a" to "d" in only the time of two cycles. In other words, the second embodiment requires four memories or registers for the variables "a" to "d" only, whereas the third embodiment can reduce the number of memories or registers by two because two memories or registers are sufficient to be assigned to the variables "a" to "d".

As described above, when the source codes of the system LSI designed by the system for assisting in design of a system LSI according to the third embodiment having a lower memory load are subjected to high-level synthesis, the high-level synthesis achieves a smaller number of memories or registers and thus a smaller chip area. Therefore, the third embodiment can sufficiently reduce the likelihood of the design process exiting from downstream operations of LSI design and returning to upstream operations thereof for redesign.

In the third embodiment, it is possible to repeat the step ST120 to the step ST124 by using each dynamic analysis results of a plurality of simulation models to obtain the "total memory load" that depends on each of the simulation models. For example, the dynamic analyzer 7 reads the test data which induces exceptional processing from the test data memory block 6 and executes the executable code by using the test data including the exceptional processing. When a previous simulation model is defined as a first simulation model, the dynamic analyzer 7 defines the combination of the executable code and the test data including the exceptional processing as a second simulation model.

In this case, the dynamic analyzer 7 is configured so that the first to "i"-th weights "W" in the above equation (3) for use in the first embodiment determine the probability of occurrence of events. The dynamic analyzer 7 sets the probability of occurrence of an event which produces the second simulation model to, for example, "0.1". The test data storage 6 also records the test data for the first simulation model which performs normal processing. The dynamic analyzer 7 executes the first simulation model and further executes the second simulation model. Then, the dynamic analyzer 7 generates the dynamic analysis results of the first and second simulation models, respectively. The memory load calculator 9 calculates the "life times" of the variables based on the dynamic analysis results of the first and second simulation models, respectively.

When the "memory load" of the first simulation model calculated by the memory load calculator 9 is equal to "588" and the probability of the first simulation model is "0.9", the memory load calculator 9 calculates the "weighted memory load" of the first simulation model by multiplying the probability "0.9" by the original memory load "588". When the "memory load" of the second simulation modes calculated by the memory load calculator 9 is equal to "1200", the memory load calculator 9 calculates the "weighted memory load" of the second simulation model by multiplying the probability "0.1" by the original memory load "1200". The memory load calculator 9 calculates a "total evaluation result" by adding the "weighted memory load" of the second simulation model to the "weighted memory load" of the first simulation model. Here, the "total evaluation result" is 649.2.

As described above, the memory load calculator 9 can define the memory load by using a plurality of simulation models composed by the plurality of test data. The use of the system for assisting in design of a module according to the third embodiment allows the simulation of a system LSI, and thus facilitates the calculation of the memory load of a model. Moreover, the selection of a model having a lower memory load achieves a higher degree of freedom of scheduling or resource sharing for high-level synthesis, so that a smaller number of memories or registers can be assigned by the high-level synthesis. Furthermore, the memory load calculated by the memory load calculator 9 is calculated from the overall simulation model. Therefore, the size of a large-scale resource may be reduced, which is difficult to high-level synthesis technique. Consequently, the number of memories or registers throughout the design of a system LSI or system on chip may be reduced.

As described above, the memory load calculated by the memory load calculator 9 can be used as metrics to judge the quality of design in the design step before high-level synthesis. In the case where there are a plurality of potential design plans in the design step before high-level synthesis, a design plan having a lower memory load calculated by the memory load calculator 9 is selected. Such selection makes it possible to manufacture a system LSI or system on chip having a smaller area at the time of high-level synthesis.

Moreover, the dynamic analyzer 7 reads the test data for a typical test from the test data memory block 6 to execute the normal simulation model. Also, the dynamic analyzer 7 reads the test data inducing exceptional processing from the test data memory block 6 to execute the abnormal simulation model. Based on the dynamic analysis results of the normal and abnormal simulation models, it is possible to calculated the "weighted memory load". Therefore, the memory load calculator 9 obtains metrics which permit judging the quality of design, considering exceptional treatment.

Other Embodiments

Although the invention has been described above by reference to the embodiment of the present invention, the present invention is not limited to the embodiment described above. Modifications and variations of the embodiment described above will occur to those skilled in the art, in the light of the above teachings.

For example, storing the plurality of source codes in the source code memory block 1 is an alternative. By calculating each "memory load" of the source codes, it is possible to choose one source code that provides smallest memory load. Also, storing the plurality of test data in the test data memory block 6 is an alternative. By calculating each "memory load" of the simulation models with different test data, it is possible to choose one test data that provides smallest memory load. Further, the design evaluation method according to the embodiment of the present invention is capable of being expressed as descriptions of a series of processing or commands for the simulator. Therefore, the method is capable of being formed as a computer program product to execute multiple functions of the CPU in the design evaluation system. "The computer program product" includes, for example, various writable mediums and storage devices incorporated or connected to the design evaluation system. The writable mediums include a memory device, a magnetic disc, an optical disc and any devices that record computer programs.

As described above, the present invention includes many variations of embodiments. Therefore, the scope of the invention is defined with reference to the following claims.

What is claimed is:

1. A design evaluation system comprising:
   a source code memory block configured to store a source code of a model simulating a system large-scale integrated circuit; and
   a central processing unit including:
      a static analyzer configured to analyze the source code by sampling a plurality of functions and a plurality of variables related to the functions from the source code;
      a compiler configured to compile the source code into an executable code;
      a dynamic analyzer configured to analyze each life start time and each life end time of the variables in case where the executable code is executed; and
      a memory load calculator configured to calculate for each variable a memory load by multiplying a life time of the variable by a size of the variable obtained from results of the analysis of the source code, to determine a number of memories or registers of the system large-scale integrated circuit based on the memory load for each of the variables, the life time being a difference between the life start time and the life end time, the size of the variable defined as a number of bytes of data stored in the variable.

2. The system of claim 1, wherein the variables contain a global variable defined outside scopes of the functions.

3. The system of claim 1, wherein the source code contains a plurality of classes.

4. The system of claim 3, wherein the variables contain each member variable of the classes defined outside scopes of the functions.

5. The system of claim 1, wherein the variables contain a temporary variable defined in each of the functions.

6. The system of claim 1, wherein the dynamic analyzer defines each start time of the functions as the life start time.

7. The system of claim 1, wherein the dynamic analyzer defines each end time of the functions as the life end time.

8. The system of claim 1, wherein the memory load calculator calculates a total sum of the memory load.

9. A computer implemented design evaluation method comprising:
   analyzing a source code of a model simulating a system large-scale integrated circuit by sampling a plurality of functions and a plurality of variables related to the functions from the source code;
   compiling the source code into an executable code;
   sampling each life start time and each life end time of the variables in case where the executable code is executed;
   calculating each life time of the variables based on the life start time and the life end time;
   calculating for each variable a memory load by multiplying the life time of the variable by a size of the variable obtained from results of the analysis of the source code, the size of the variable defined as a number of bytes of data stored in the variable; and determining a number of memories or registers of the system large-scale integrated circuit based on the memory load for each of the variables.

10. The method of claim 9, wherein the variables contain a global variable defined outside scopes of the functions.

11. The method of claim 9, wherein the source code contains a plurality of classes.

12. The method of claim 11, wherein the variables contain each member variable of the classes defined outside scopes of the functions.

13. The method of claim 9, wherein the variables contain a temporary variable defined in each of the functions.

14. The method of claim 9, wherein sampling the life start time and the life end time further comprises defining each start time of the functions as the life start time.

15. The method of claim 9, wherein sampling the life start time and the life end time further comprises defining each end time of the functions as the life end time.

16. The method of claim 9, further comprising calculating a total sum of the memory load.

17. A computer program product stored on a computer-readable medium and configured to be executed by a design evaluation system, the computer program product comprising:

instructions configured to analyze a source code of a model simulating a system large-scale integrated circuit by sampling a plurality of functions and a plurality of variables relating to the functions from the source code within the system;

instructions configured to compile the source code into an executable code within the system;

instructions configured to sample each life start time and each life end time of the variables within the system in case where the executable code is executed;

instructions configured to calculate each life time of the variables within the system, based on the life start time and the life end time;

instructions configured to calculate for each variable a memory load by multiplying the life time of the variable by a size of the variable obtained from results of the analysis of the source code within the system, the size of the variable defined as a number of bytes of data stored in the variable; and instructions configured to determine a number of memories or registers of the system large-scale integrated circuit based on the memory load for each of the variables.

* * * * *